United States Patent [19]
Ahmed

[11] Patent Number: 5,427,671
[45] Date of Patent: Jun. 27, 1995

[54] ION VAPOR DEPOSITION APPARATUS AND METHOD

[75] Inventor: Nadir A. G. Ahmed, Compstall, England

[73] Assignee: Applied Vision Limited, Leeds, Great Britain

[21] Appl. No.: 842,367

[22] PCT Filed: Feb. 8, 1990

[86] PCT No.: PCT/GB90/00195

§ 371 Date: May 26, 1992

§ 102(e) Date: May 26, 1992

[87] PCT Pub. No.: WO91/05077

PCT Pub. Date: Apr. 18, 1991

[30] Foreign Application Priority Data

Sep. 26, 1989 [GB] United Kingdom ............. 8921666

[51] Int. Cl.$^6$ ............................................. C23C 14/46
[52] U.S. Cl. ........................ 204/298.23; 204/192.11; 204/298.04; 204/298.11; 118/720; 118/729
[58] Field of Search .............. 204/298.02, 298.04, 204/298.05, 192.11, 298.23; 118/720, 728, 733, 50, 729

[56] References Cited

U.S. PATENT DOCUMENTS

| | | | |
|---|---|---|---|
| 2,260,471 | 10/1941 | McLeod | 91/12.2 |
| 3,583,361 | 6/1971 | Laudel | 204/298.03 |
| 3,750,623 | 8/1973 | Carpenter et al. | 204/298.05 |
| 3,775,285 | 11/1973 | Lane | 204/298.26 |
| 4,420,385 | 12/1983 | Hartshough | . |
| 4,588,942 | 5/1986 | Kitahara | 324/71.5 |
| 4,596,645 | 6/1986 | Stirn | 427/573 |
| 4,690,744 | 9/1987 | Naoe et al. | 204/298.04 |
| 4,851,095 | 7/1989 | Scobey et al. | . |
| 4,902,398 | 2/1990 | Homstad | . |
| 5,017,277 | 5/1991 | Yoshida et al. | 204/298.02 |
| 5,124,013 | 6/1992 | Seddon et al. | . |
| 5,130,005 | 7/1992 | Hurwitt et al. | 204/298.2 |

FOREIGN PATENT DOCUMENTS

| | | |
|---|---|---|
| 0328257 | 6/1989 | European Pat. Off. . |
| 94790A2 | 7/1992 | European Pat. Off. . |
| 1244619 | 9/1971 | United Kingdom . |
| 2180262 | 3/1987 | United Kingdom . |

OTHER PUBLICATIONS

Y. Togami et al., "Sputtering System For the Preparation of Compositionally Modulated Films", *Japanese Journal of Applied Physics*, vol. 26, No. 4, pp. 635–636, Apr. 1987.

Technical Paper–Metamode, Authors: R. I. Seddon and Paul M. LeFebvre. Presented at SPIE International Symposium on Optical and Optoelectronic Applied Science & Engineering, Jul. 8–13, 1990, San Diego, Calif.

Alternating Ion Plating–A Method of High Rate Ion Vapor Deposition, Authors: S. Schiller, U. Heising and K. Goedicke. Presented in the Vacuum Society Technology vol. 12 No. 4 Jul./Aug. 1975 publication.

Ion Plating–A New Promising Vacuum Coating Process. Authors: S. Schiller, U. Heisig and K. Goedicke, Presented at 4th International Electron Beam Processing Seminar, Long Island, N.Y., USA, Apr. 1976.

Advances in High Rate Sputtering with Magnetron–Processing and Instrumentation, S. Schiller, U. Heisig, K. Goedicke, K. Schade G. Teschner and J. Henneberger. Presented at the International Conference on Metallurgical Coatings, San Diego, Calif., USA, Apr. 23–27, 1979.

Hollow-Cathode-Enhanced Magnetron Sputtering, J. J. Cuomo and S. M. Rossnagel. Vacuum Science Technology A4 (3) May/Jun., 1986.

*Primary Examiner*—Anthony McFarlane
*Attorney, Agent, or Firm*—Zarley, McKee, Thomte, Voorhees & Sease

[57] ABSTRACT

An ion vapor deposition (IVD) apparatus includes an IVD chamber, a vacuum pump for creating a vacuum in the chamber, and a source of ionizing gas. One or more target materials are mounted in the chamber and a holder is provided for holding the object to be coated. An electrical power source electrically biases the target materials. A mask covers the target materials and is movable relative to the target materials for selectively exposing respective target materials.

8 Claims, 4 Drawing Sheets

ION VAPOR DEPOSITION APPARATUS AND METHOD

BACKGROUND OF THE INVENTION

This invention relates to ion vapour deposition (herein IVD) and relates to a method of and apparatus for applying coatings by IVD.

The invention has particular reference to the application of coatings to optical lenses of the type used in spectacle frames, and which mainly will be corrective lenses, but could be plain lenses, but in fact the invention it is believed will have a much wider application, at least in specific aspects thereof, such that the invention can be applied to the application of coatings to other articles.

The lenses to which the invention applies may be of glass or plastics material.

As the main application as will be understood relates to the application of IVD coatings to spectacle lenses, reference will be made hereinafter exclusively or mainly to such a product and the coating thereof.

The IVD process comprises the placement of an article to be coated in a chamber in which is provided a target of the coating material. Negative electric bias is applied to the target, and the chamber is filled with an inert gas, such as argon. Ionisation of the gas takes place, and the gas positive ions bombard the target by virtue of being attracted thereto due Ira the negative electric bias on the target. Sputtering of the target takes place which is a phenomenon resulting in the release of particles of the target material into the chamber atmosphere. These particles then deposit on the surface of the article to be coated and may be induced to deposit on the article by virtue of an electric bias on the article or in the region of the chamber surrounding the article, and so a coating is built up.

IVD processes are of course well established for many products, and are typically used for metallic products which require to be coated to a high degree of accuracy, and where the articles have to be used in controlled environments or in situations where the performance of the articles is critical. For example IVD coated articles such as screws, nuts and bolts may be used in the aircraft industry, in military applications, or in space vehicle applications. The prior devices use a target with one material attached to it. Therefore only one single material can be sputtered from the target.

The use of IVD for the coating of spectacle lenses is also known. Coatings on spectacle lenses perform several functions. Firstly, a reflection control coating serves to allow as much light of wavelength in the visible range through the lens into the eye as possible, whilst reflecting as much light which is in the harmful wavelength region, such as UV light, from the eye as possible. Other IVD coatings serve to provide a hard protective surface to protect the lenses from scratching and the like.

Generally speaking, the equipment which is used for IVD coating of lenses is large and is expensive, and requires considerable investment in the part of a processor, and in commercial terms when a person orders a pair of spectacles from an optician, he submits the prescription to a lens manufacturer, but the lens manufacturer in turn will pass on the lenses to the IVD coating processor who will coat the lenses as required. Coating in the conventional machine can take as much as one hour.

SUMMARY OF THE INVENTION

The present invention arises out of the objective of providing a relatively small and inexpensive lens coating IVD machine, although it is recognised that some aspects of the invention have wider application.

In accordance with a first aspect of the invention, the apparatus comprises a small IVD chamber for receiving lenses to be coated by IVD, said chamber having means for the introduction of ionising gas, a target material mounting in the chamber, and a lens mounting in the chamber, and further including a power source for electrically biasing the target mounting, which in turn serves to bias a target mounted thereon.

In one embodiment, the chamber is typically a rectilinear chamber of dimensions in the range 30 cm diameter, and of appropriate height.

The chamber preferably has a viewing aperture by which the IVD process being performed therein can be observed.

The target mounting is preferably such as to be capable of selectively presenting a target of any one of two or more target materials to the ionising gas so that, without removing the lenses or the target meterials from the chamber, layers of different target materials can be deposited on the lenses in sequence. This selective utilisation of different target materials has wider application, and can be used in any IVD processing system.

The mounting may comprise a mask or shield for covering the target materials, said mask or shield being movable relative to different target materials held by the mounting for selectively exposing respective target materials.

Typical target materials which may be used in connection with the coating of lenses comprise titanium dioxide and silicon dioxide for providing the reflective coating on the lenses, and titanium for providing the anti-scratch coating on the lenses. These coatings may be laid down on the lenses in sequence by appropriate operation of the apparatus.

The target mounting may comprise a first or main body in the form of a metallic block connected to the power source, said block preferably having passages therein connected for the supply and return of cooling water whereby the block may be water cooled. There may be a second target mounting component serving to carry polarisation magnets of the mounting, and a third target mounting part may comprise a compartmentalised disk having different compartments for receiving different target materials, said disk co-operating with said mask for the selective exposure of the different materials.

The power source may comprise a high voltage DC or radio frequency AC supply for the charging of the target material.

Appropriate connections may be provided for the delivery and exhaust of the ionising gas.

The article mounting may comprise a cap which is conical or hemispherical and is made up of segments each adapted to carry a plurality of articles such as spectacle lenses, and the segments may be rotatable so that both sides of the lenses carried thereby can be treated.

The article mounting may also be rotatable in order to ensure that the coating material is applied evenly to the lens surfaces, and to enhance the operation, a bias potential may be applied to the mounting In order to attract the coating particles during IVD and improve adhesion.

The IVD can be further enhanced by providing inside the chamber a filament and cathode which are appropriately biased.

According to another aspect of the invention there is provided IVD apparatus comprising:

i) an IVD chamber for receiving articles to be coated by IVD;
ii) vacuum creating means for creating a vacuum in the chamber;
iii) gas introduction means for introducing ionising gas into the chamber;
iv) electric means for creating ion vapour discharge in the chamber;
v) a holder for holding articles to be IVD coated;
vi) at least two target material holding means in the chamber;
vii) high voltage biasing means for biasing the target holding means;
viii) target materials in said holding means;
ix) a shield means which is positionable between a first position covering one of the target materials whilst the other is sputtering, and a second position in which the other target material is covered whilst the said one is sputtering;
x) means for moving the shield means between the first and second positions; and
xi) control means for detecting the build up of coating on the articles when the said one target is sputtering and for operating said means for moving when a predetermined build up of coating on said articles has taken place, to terminate said sputtering of the said one target and to permit sputtering of said second target.

The holder for holding the articles to be coated may comprise a member having apertures therein for holding individual ones of said articles, and preferabaly the member comprises a circular disc mounted for rotation in the chamber about its centre.

The target material holding means may comprise two magnetrons arranged spaced and opposite in the chamber, each holding a target material, the sputtering surfaces of the materials, which surfaces are flat, being in the same plane.

The shield may comprise a shield plate defining two arms which respectively cover the target materials in the first and second positions and in a preferred construction the shield plate may comprise a third arm, and the shield plate has a third position in which two of the arms of the plate cover the respective target materials.

The control means may comprise a crystal oscillator of which the crystal is located in the chamber adjacent the target materials to detect the rate of sputtering thereby to determine the period during which sputtering should take place to achieve the predetermined build-up of coating on the articles. The control means may be programmed or programmable to cause the shield to move between the first and second positions a number of times to cause the application of alternate, predetermined thickness layers of the target materials to the articles.

The various constructional features enable the machine of each embodiment to provide coatings on lenses in a convenient and simple manner, and such machines can be utilised on a "do-it-yourself" basis by lens manufacturers which means that lenses can be manufactured for use in a shorter time, and the lens manufacturers do not have the inconvenience of having to sub-contract the coating operation.

The various aspects of the invention are in the way of machine and apparatus features, and also in the various method steps involved in performing the IVD operations. Aspects of the machine and method can be utilised as will be clearly understood in areas outside the area of lens coating.

By way of example only, embodiments of the invention will now be described with reference to the accompanying diagrammatic drawings, wherein:

DETAILED DESCRIPTION OF THE PREFERRED EMBODIMENT

Figure 1:
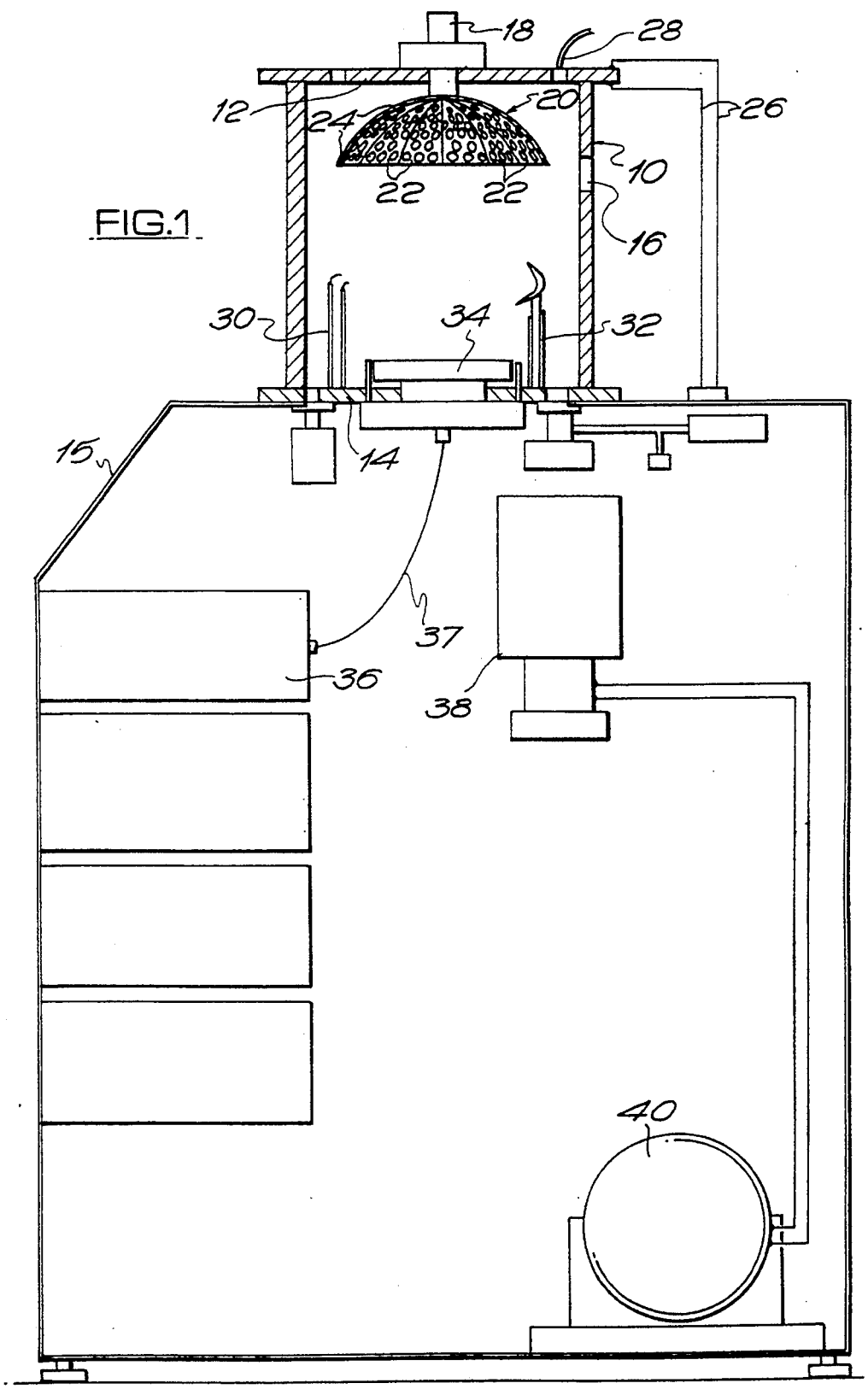
FIG. 1 is a sectional elevation of a machine according to one embodiment of the invention.
Figure 2:
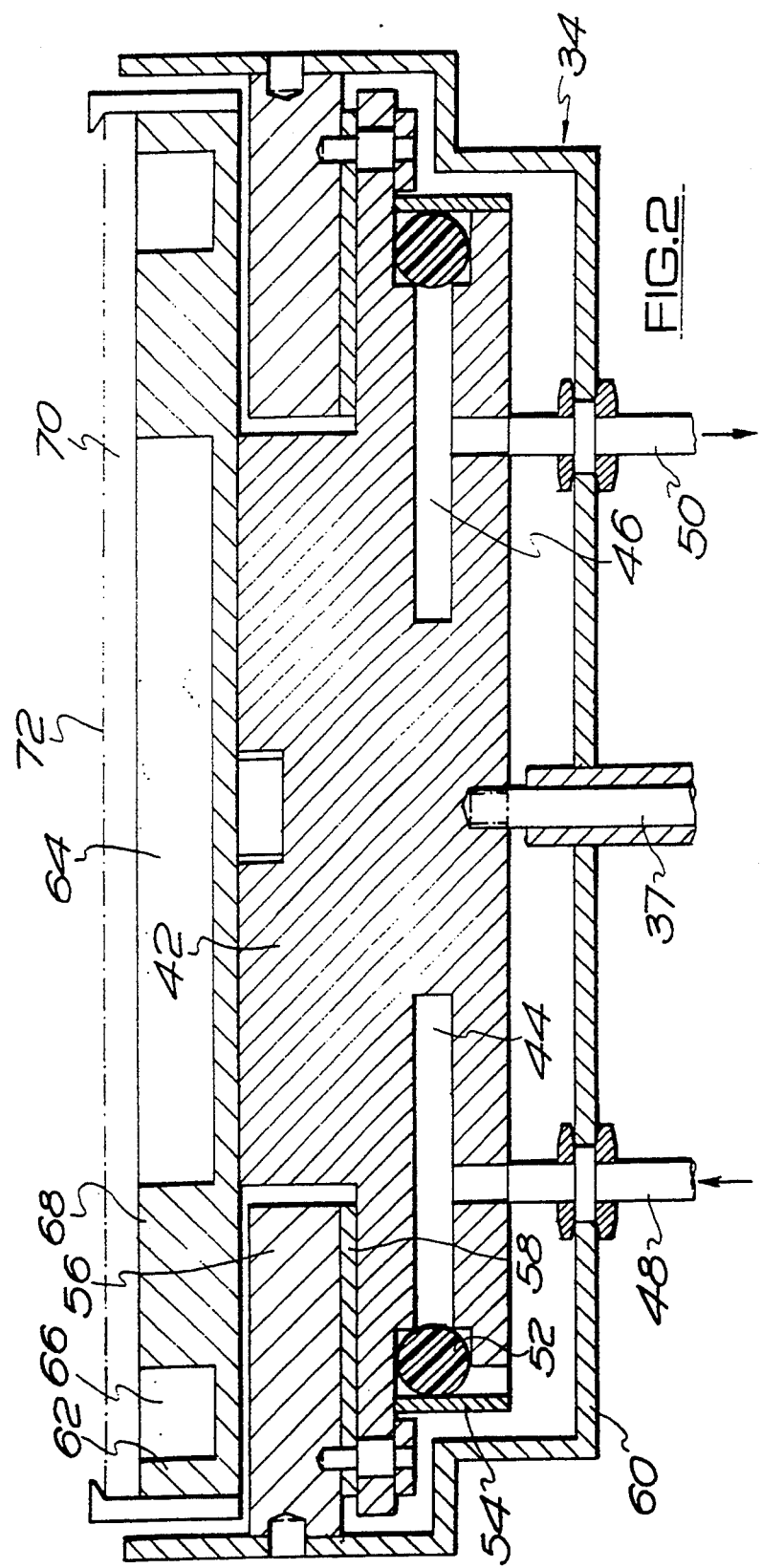
FIG. 2 is a sectional elevation of the target mounting of the machine shown in FIG. 1.

Referring firstly to FIGS. 1 and 2 of the drawings, in FIG. 1 chamber 10 may suitably be made of aluminium or steel plate, and the chamber is provided with a lid 12 and a base 14. The chamber stands on a casing 15 so that it will be located at a suitable working height. A typical sized chamber will have the following dimensions; diameter=30 cm, height=35 cm The chamber wall is provided with a viewing window 16 whereby the IVD process going on inside the chamber can be viewed. Such a viewing window is not be necessary especially when the process is carried out under automatic control, or if the chamber is constructed from glass, which is a possible embodiment of the invention.

The lid 12 supports an electric motor 18 which is drivingly connected to a mounting 20 inside the chamber by which the lenses to be coated may be supported. Rotation of motor 18 effects rotation at the appropriate speed of the mounting 20. Such rotational speed may typically be 5-10 r.p.m.

The mounting 20 is calotte shaped, and is made up of a number of segments 22 each of which is provided with a plurality of apertures 24 for receiving the lenses to be coated. The lenses are held in the apertures so that one side of each lens so held faces downwardly into the chamber. The individual segments 22 may be rotatable so as to bring the other sides of the lenses into downwardly facing position. The lid 12 may be electrically biased by the application of a suitable voltage through leads 26, which in turn biases the mounting 20 for the effective IVD coating on the lenses supported by the mounting 20, as will be explained hereinafter.

The lid also is provided with an inlet valve 28 by which the ionising gas may be introduced into the chamber 10. The flow of gas through valve 28 is controlled by means of a pressure controller (not shown).

Also contained within the chamber 10 are an electron source in the form of a hot wire filament 30 and a positively biased probe 32. The use of this filament and probe raises the ionisation efficiency of the system which leads to an improvement in the efficiency of ionisation by a factor of 100 in comparison with conventional diode arrangements.

The chamber 10 furthermore contains a target material holder 34 for supporting the material which will be subjected to sputtering during operation in order to give off the particles which will eventually form the coating on the lens surfaces. The target material holder 34 is electrically biased through lead 37 by means of a high voltage DC or radio frequency AC generator 36 which is mounted in the casing.

The chamber 10 is evacuated using a turbo molecular pump 38 in series with a rotary pump 40, said pumps being contained within the casing 15.

In use, target materials are supported on target material holder 34, a vacuum is pulled in the chamber by means of the pumps 38 and 40, the lenses to be coated are mounted on the segments 22, and ionising gas is introduced into the chamber through valve 28. The utilisation of the filament 30 and the probe 32 results in ionisation of the gas which is attracted to the high voltage biased material carried by target material holder 34 which is then subjected to sputtering and the particles, such as aluminium particles of the target are released into the atmosphere in the chamber and are attracted to the mounting 20 and thereby coat the downwardly facing surfaces of the lenses. At the appropriate time, the segments 22 can be reversed for the coating of the opposite sides of the lenses. At the same time, the mounting 20 is rotated so that an even coating is achieved.

The construction of target material holder 34 is shown in more detail in FIG. 2, and it is to be mentioned that the mounting is a magnetron sputtering target mounting. The mounting 34 consists of three main parts. The first part 42 is a metallic block having passages 44 and 46 through which cooling water may be circulated by virtue of the water flowing inwardly through coupling 48 and exiting through discharge 50. The body 42 is subjected to the high voltage DC or radio frequency through lead 37, and it is well isolated from earth. The cooling water circulates through the passages 44 and 46 in effecting the cooling of the body 42.

The body has a circumferential groove which is sealed by means of O-ring seal 52 and this seal is maintained in position by means of a surrounding metal ring 54. The main body 42 is connected to an earth disc 56 through an insulator disc 58 and an earth casing 60 is connected to the disk 56 and acts as a cathode shield. The earth disc is used around the sputtering target and at a small distance from it to prevent arcing or discharge. If there is no such disc, arcing or discharge may take place with the side walls of the sputtering target thus sputtering the holder material and therefore contaminating the chamber.

The second part of the target mounting comprises a holder 62 which houses two magnets namely a solid disc magnet 64 which is arranged centrally of the holder 62, and an annular ring magnet 66 which surrounds disc 64 but is separated therefrom by an aluminium ring 68 which lies between the two magnets and is machined in the body 62. The body 62 is screwed to the first body 42 to provide the necessary water cooling and electrical contacts. These magnets are used in the sputtering target to trap secondary electrons emitted from the target surface. This trapping increases the ionisation of the gas molecules thus increasing the sputtering rate from the target surface.

The third part of the target material holder 34 is a body consisting of a disc 70 which is divided into many compartments to house target materials which may be the same or different. The disc 70 is screwed to the second body 68. A mask 72 covers the disc 70 but is provided with a triangular cut-out which is positioned over the required section of the disc 70 so that only the material which is facing the cut-out section is allowed to sputter at any one time. The mask is rotationally adjustable relative to the disc so as to face the selected material for sputtering. The mask is located at a small distance from the disc 70 to prevent the generation of a flow discharge between the mask and the sputtering target. The sputtering target could be located in the top or lower base of the chamber, or in any other convenient location in the chamber. The target materials can be used in the form of solids or densely packed powder bonded to a metal plate.

Argon is the gas mainly used for the chamber to create the discharge and sputtering. However, for reactive coating, argon reactive gas mixtures are used to provide the required reaction.

It will be appreciated that appropriate electrical insulation will be provided in order to ensure the electrical effects. For example the drive shaft which rotates the mounting 20 will be appropriately insulated.

Figure 3:
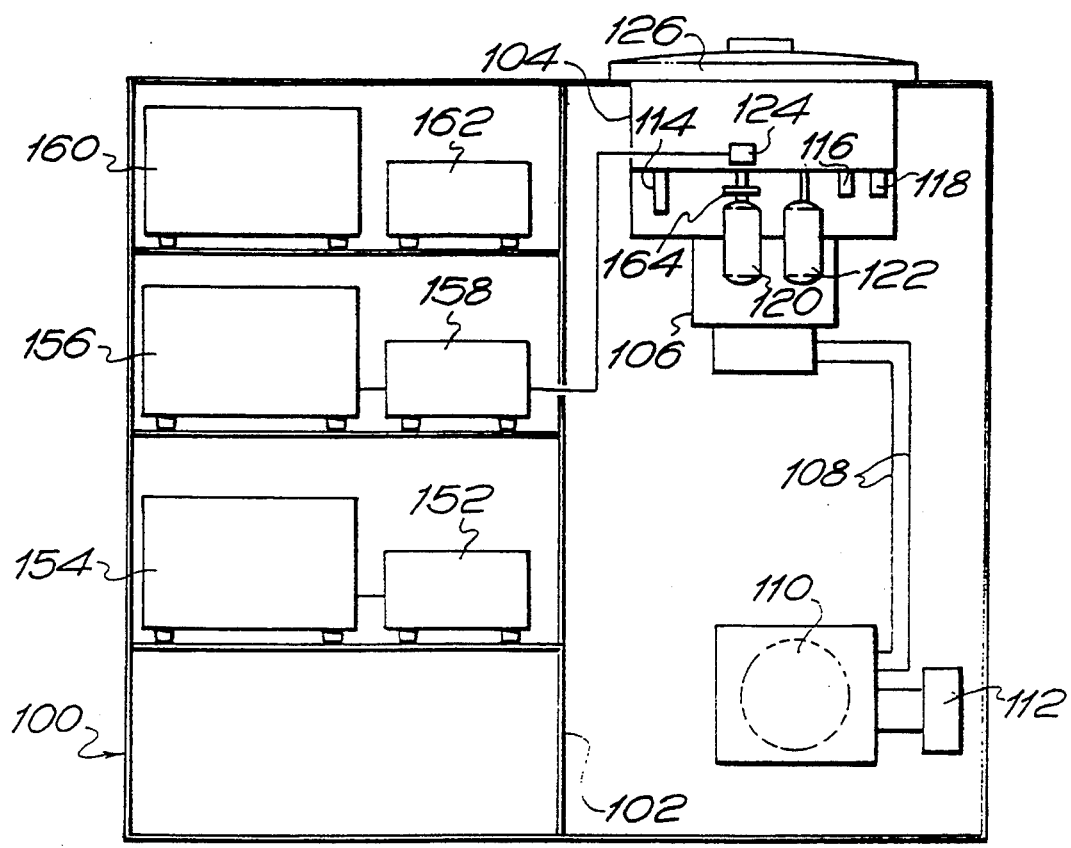
FIG. 3 is a side elevation of a machine according to another embodiment of the invention.

Referring now to FIGS. 3-7 which show another embodiment of the invention, the machine shown in FIG. 3 comprises a casing 100 which as shown is divided vertically by a partition 102. The casing may typically be approximately 1.25 m sq in height and width, and it may typically be 0.75 of a meter in depth. These dimensions give some idea of the size of the machine, as this machine is of a much smaller overall size compared to the existing conventional machines for carrying out the same process.

The machine in the top right hand compartment is provided with the IVD chamber 104 which is of the configuration shown An FIG. 4 and described hereinafter in greater detail. Also in the compartment As the turbo molelcular pump 106 which is connected in series via the duct 108 with a rotary pump 110. To this pump is connected a trap 112 for the removal of gases and moisture so that the atmosphere vacated from the chamber 104 can be discharged into the surrounding air. To the underside of the chamber 104 is a gas inlet 114 and monitoring vacuum gauges 116 and 118 also enter the base of the chamber.

Two motors 120 and 122 serve for rotating a target covering shield contained in the chamber and a holder plate for the lenses to be coated. A crystal detector 124 is contained in the chamber for detecting the rate of sputtering and hence the rate of deposition of coating material on the lenses for the automatic control of the process as will be described.

Figure 4:
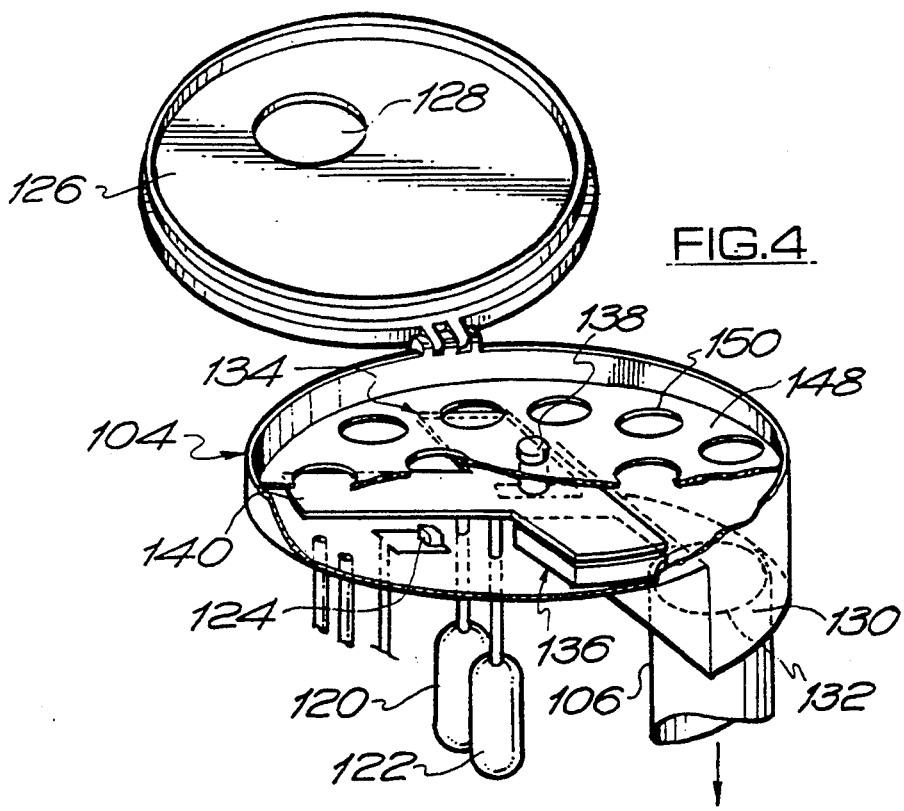
FIG. 4 is a perspective, partly cut away view of the IVD chamber of the machine of FIG. 3.

A lid 126 closes the cheer, and the lid as shown clearly in FIG. 4 can be swung to an open position to allow access to the interior of the chamber. The lid 126 has a viewing aperture 128 whereby the discharge inside the chamber can be viewed but by virtue of the principle of operation of this machine such viewing aperture is not strictly necessary as control of the process is automatic.

If reference is made now to FIG. 4, the chamber 104 wall be seen to comprise a shallow cylindrical chamber which to one side has a deep well portion 130 at the base of which Is an aperture 132 which couples to the turbo molelcular pump 106 whereby the chamber can be vacated.

Figure 5:
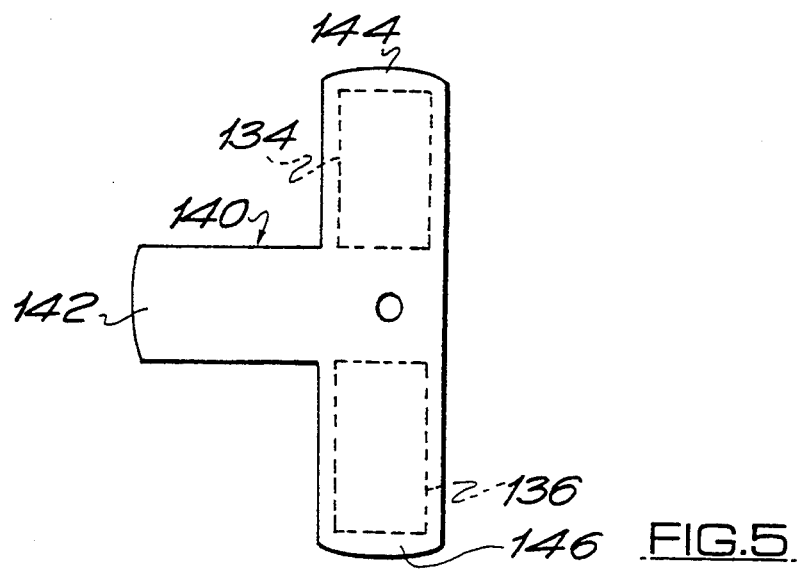
FIGS. 5, 6 and 7 show in plan view the respective positions of the shield for the respective operational conditions of the machine shown in FIG. 3.
Figure 6:
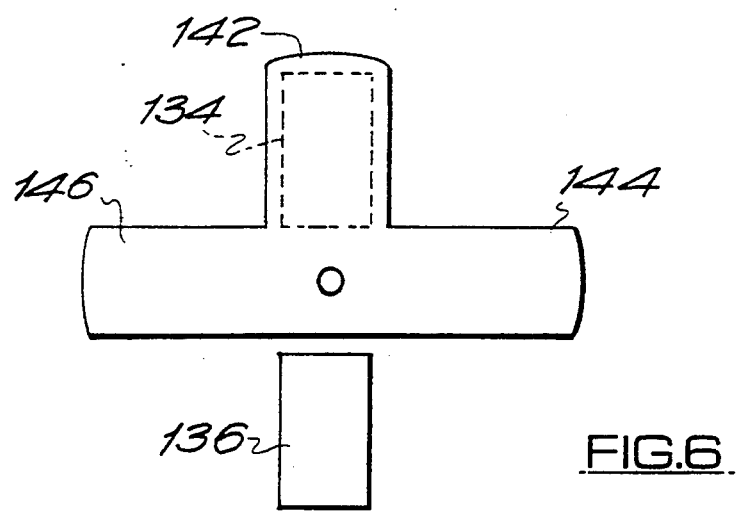
Figure 7:
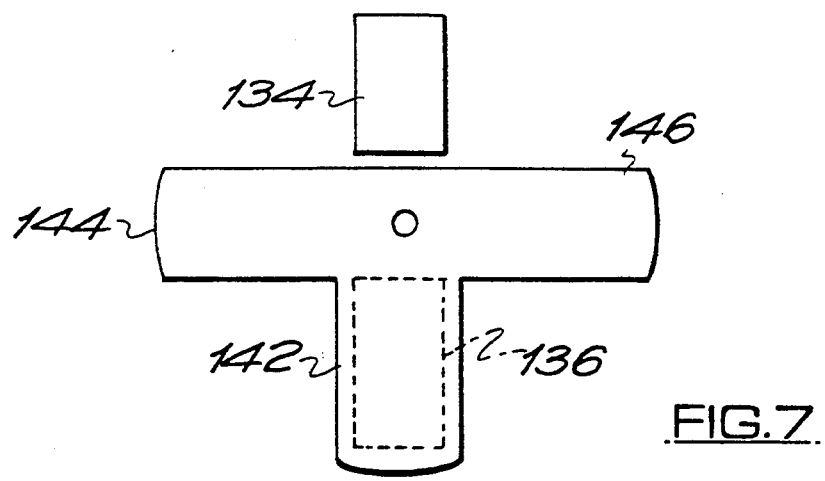

On the base of the shallow portion of the chamber there are two assemblies 134 and 136 which are magnetrons and also carry target materials which are electrically biased for the sputtering effect to be described herein. A drive shaft 138 passes through the base of the chamber and lies between the assemblies 134 and 136, and carries a shield plate 140. The shield plate 140 is T-shaped and has three arms 142, 144 and 146 best seen in FIGS. 5–7. The shield plate 140 is drivable about the axis of the shaft 138 by the motor 120 shown in FIG. 1 and also FIG. 4 so that in fact the shield plate can be positioned in any of three positions shown respectively in FIGS. 5, 6 and 7. In fact the position shown in FIG. 5 is the third or park position in which the arms 144 and 146 respectively cover the target assemblies 134 and 136. In the position shown in FIG. 6, which is the first position, the shield is turned clockwise from the FIG. 5 position through 90° so that the target 136 is exposed and the target 134 is covered by the arm 142. In the FIG. 7 or second position, the target 136 is covered whilst target 134 is exposed. When a target is exposed it can sputter in order to release particles for the coating of the lenses.

The lenses are carried by a circular disc 148 having apertures 150 therein for receipt of the individual lenses and the disc 148 is supported on the axis of shaft 138, and is rotatable around said shaft axis by means of the motor 122. The turning of the plate 148 during the process results in even coating of the lenses.

Reverting to FIG. 3, in the left hand side of the cabinet there are shelves supporting various control units comprising radio frequency power unit 152 for powering the magnetrons 134, 136 with the target materials. The radio frequency power unit operates at the order of 13.56 MHz and at a power in the range 300–6000 watts. The unit 154 is a tuner for the RF power unit and this tuner may be manually operated or may be under automatic control.

A programmer 156 is provided whereby the machine can be programmed to coat the lenses to a predetermined extent and in a predetermined manner, and the programmer is associated with a control alarm unit 158 and the units 156 and 158 are coupled to the oscillator 124 for detection and automatic control.

The unit 160 is a drive for the turbo molecular pump 106 and unit 162 is a pressure recording unit for recording the pressure in the cheer 104.

In the use of the apparatus, with the pumps off, the lid 126 is opened and the plate 148 is loaded with the lenses to be coated. The shield 140 is in the third or park position shown in FIG. 5. The programmer 156 is programmed to give a preset sequence of coating operations and the machine is ready to be started. The lid 126 is closed and forms an air tight seal with the remainder of the chamber and then the pumps 106 and 110 are switched on in order to pull the correct vacuum in the chamber 104. In this example of the invention the required degree of vacuum $10^{-5}$ torr is achieved approximately in 12 minutes. When the correct vacuum has been achieved, the ionising gas is introduced into the chamber and a weak discharge is created in the chamber and around the lens to provide a plasma which in fact bombards the lenses and cleans same. This plasma is generated by appropriate creation of electrical bias as described in relation to the FIG. 1 embodiment by suitable filament and probe means such as 30 and 32 provided inside the chamber. After a predetermined period, the etching process is terminated. It might be mentioned that prior to placement of the lenses an the chamber they may be cleaned using a cleaning fluid such as IPA (iso propyl alcohol) and the etching is a cold process carried out at room temperature. When one considers this with the prior art method of precleaning favourable results are apparent, because in the prior art it is usual to initially etch the lenses using a caustic solution to which ultrasonic vibrations are applied, followed by subsequent washings and treatment using de-mineralised water, ultrasonic vibration being used at each stage. Subsequently a fluoron gas is used for vapour cleaning and thermal evaporation takes place at a temperature in the order of 1500°–1700° C. Furthermore in the prior method visual examination and checking must take place at all times whereas with the method described above using cold gas etching visual examination is not necessary. The cold gas etching is a sputtering process.

At the end of the initial cleaning step, the magnetrons are powered, and the shield 140 is moved either to position 6 or position 7. The lens holder continues to be electrically biased whilst the magnetrons are powered, and the exposed target starts to sputter and a first layer is deposited on the lenses. When the thickness of the first layer reaches a predetermined value as determined by the programming and as detected by the oscillator, the shield 140 is moved to the alternate position exposing the other target and the process is repeated. As many layers of the respective targets and in any particular order can be deposited. The controller for positioning the shield 140 is an optical controller 164 carried by the shaft of the motor 120.

In the arrangement of FIG. 4, two sputtering target assemblies are shown, but At is possible to have more than two if required.

The power to the magnetrons may be cut off whilst the shield is being repositioned in order to prevent contamination of one target by the other.

At the end of the process, which is automatically controlled by the programmer 156 the power to the magnetrons is automatically switched off, and the chamber is vented to atmosphere. The venting may be such that the venting is controlled so that the machine may require a few minutes before the lid 126 can be opened.

An advantage of the arrangement described is that the oscillator in maintaining a monitor on the sputtering rate gives an excellent and reliable control on the thickness of each layer deposited. It is not necessary to visually examine the sputtering as is often the case in conventional IVD apparatus.

As described in relation to the FIG. 1 embodiment, the magnetron assemblies are water cooled and an appropriate water circulation system is provided for this purpose. The pumps in each embodiment preferably also are water cooled.

The utilisation of a third electrode in the chamber, as described in relation to FIG. 1 improves the ionisation and sputtering effect in increasing the ion collisions.

In a preferred feature of the embodiment described, the radio frequency or high voltage DC signal for the magnetrons is supplied through the drive shaft which may be insulated by a suitable bush from the chamber base and there is effective sealing of the drive shaft from the base to enable high vacuums to be drawn inside the chamber.

As mentioned herein any feature of the FIG. 1 embodiment can be used where appropriate In the FIG. 3 embodiment and vice versa, and the applicant reserves the right to make a claim for any feature or combination of features or method step or combination of method steps as described herein whether such feature or method step or combination of features and method steps is or are derived from either or both embodiments described.

The machines described have many advantages including but not limited to the following.

1. Uniform and adherent multi-layered anti-reflection coatings can be deposited on both sides of glass or plastic lenses.
2. Many thin layers can be deposited without interrupting the process.
3. By using thermionically assisted triode discharge it is possible to operate at low gas base pressure thus making the processs more efficient and less expensive in terms of gas consumption.
4. It is possible to control indpenedently the lens holder bias, gas pressure, reactive gasses pressure and discharge current density.
5. Different reactive gasses could be employed to deposit various layers including "hard diamond" coating which is a carbon coating having a hardness similar to that of diamond.
6. Dense coating can be achieved by increasing the ionisation efficiency and lowering the gas pressure.
7. Metals, semi-conductors and Insulators could be sputtered using the process.
8. The magnets of the sputtering target at least in the FIG. 1 and 2 embodiment can be easily removed for maintenance or re-magnetisation.
9. Minimum temperature rise on the lenses during coating process. Access for thermal evaporation may be provided via extra holes in the base plate of the vacuum chamber, by which extra electrodes can be inserted to provide the low tension necessary for thermal evaporation.
10. Thermal evaporation could be carried out in the same unit with minimum modification.

The equipment described is also suitable for pulsed gas mechanism to produce reactive coatings. A pulsed gas mechanism occurs when gas is pulsed into the vacuum chamber rather than injected continuously. Thus the discharge can be sustained using firstly low pressure inert gas then a reactive gas such as oxygen pulsed into the chamber in a flow thus for example providing oxides. A reactive coating is a coating carried out in the presence of a reactive gas to produce an oxide, nitride or carbide. A third electrode assembly can be used to support the discharge at low argon pressure. The third electrode may be a metal plate inserted into the chamber above the evaporation beats or sputtering target to enhance the discharge. The plate Is positively biased to sustain the discharge at low gas pressure.

I claim:

1. An ion vapour deposition (IVD) apparatus comprising:

i) an IVD chamber for receiving articles to be coated by IVD;
   ii) vacuum creating means for creating a vacuum in the chamber;
   iii) gas introduction means for introducing ionizing gas into the chamber;
   iv) electric means for creating ion vapour discharge in the chamber;
   v) a holder rotatably mounted in the IVD chamber for holding articles to be IVD coated;
   vi) at least first and second target material holding means in the chamber;
   vii) a first target material and a second target material different from said first target material mounted in said first and second target material holding means, respectively;
   viii) high voltage biasing means for biasing the first and second target materials in the first and second target material holding means so as to cause sputtering of said first and second target materials;
   ix) control means for selectively controlling the sputtering of said first and second target materials to provide a multi-layered coating on said articles to be IVD coated;
   x) means for rotating the holder relative to the first end second target material holding means during the sputtering of said first and second target materials;
   xi) shield means covering said first and second target materials and being movable to a plurality of positions to cause application of alternate selected thickness layers of said first target material or said second target material.

2. An apparatus according to claim 1, wherein said chamber comprises a cylindrical chamber.

3. An apparatus according to claim 1, wherein the electric means for creating ion vapour discharge includes a hot wire filament and/or a positively biased probe.

4. An apparatus according to claim 3, wherein the holder for holding the articles to be coated comprises a disc having means for holding individual ones of said articles.

5. Apparatus according to claim 1, wherein said first and second target material holding means comprises two spaced magnetrons each holding a target material, the sputtering surfaces of the materials, which surfaces are flat, being in the same plane.

6. Apparatus according to claim 1 wherein said means for creating a vacuum comprises a turbo molecular pump and a rotary pump in sequence adapted to create a vacuum in the order of $10^{-5}$ torr.

7. Apparatus according to claim 1, wherein the control means comprises a crystal oscillator of which the crystal is located in this chamber adjacent the target materials to detect the rate of sputtering thereby to determine the period during which sputtering should take place to achieve the predetermined build up of coating on the articles.

8. Apparatus according to claim 1 wherein the chamber is of the order of 30–60 cm.

* * * * *